(12) United States Patent
Feil et al.

(10) Patent No.: US 11,069,639 B2
(45) Date of Patent: Jul. 20, 2021

(54) SEMICONDUCTOR MODULE, ELECTRONIC COMPONENT AND METHOD OF MANUFACTURING A SEMICONDUCTOR MODULE

(71) Applicant: Infineon Technologies Austria AG, Villach (AT)

(72) Inventors: Thomas Feil, Villach (AT); Danny Clavette, Greene, RI (US); Carsten von Koblinski, Villach (AT)

(73) Assignee: Infineon Technologies Austria AG, Villach (AT)

( * ) Notice: Subject to any disclaimer, the term of this patent is extended or adjusted under 35 U.S.C. 154(b) by 0 days.

(21) Appl. No.: 16/282,401

(22) Filed: Feb. 22, 2019

(65) Prior Publication Data

US 2019/0267343 A1 Aug. 29, 2019

(30) Foreign Application Priority Data

Feb. 23, 2018 (EP) .................................... 18158473

(51) Int. Cl.
*H01L 23/00* (2006.01)
*H01L 21/56* (2006.01)
(Continued)

(52) U.S. Cl.
CPC ............ *H01L 24/08* (2013.01); *H01L 21/486* (2013.01); *H01L 21/4857* (2013.01); *H01L 21/56* (2013.01); *H01L 21/561* (2013.01); *H01L 21/6835* (2013.01); *H01L 21/78* (2013.01); *H01L 23/293* (2013.01); *H01L 23/3135* (2013.01); *H01L 23/3178* (2013.01); *H01L 23/3185* (2013.01); *H01L 23/5383* (2013.01); *H01L 23/5384* (2013.01); *H01L 23/5389* (2013.01); *H01L 24/03* (2013.01); *H01L 24/05* (2013.01); *H01L 24/06* (2013.01); *H01L 24/24* (2013.01); *H01L 24/25* (2013.01); *H01L 24/73* (2013.01); *H01L 24/82* (2013.01); *H01L 24/96* (2013.01); *H01L 25/072* (2013.01); *H01L 25/16* (2013.01); *H01L 27/088* (2013.01); *H01L 23/3107* (2013.01); *H01L 24/48* (2013.01); *H01L 2221/6834* (2013.01);
(Continued)

(58) Field of Classification Search
None
See application file for complete search history.

(56) References Cited

U.S. PATENT DOCUMENTS

| 2004/0113283 A1 | 6/2004 | Farnworth et al. |
| 2012/0091468 A1 | 4/2012 | Choi et al. |

(Continued)

FOREIGN PATENT DOCUMENTS

| EP | 2913487 A1 | 9/2015 |
| EP | 3531446 A1 | 8/2019 |

*Primary Examiner* — Nicholas J Tobergte
*Assistant Examiner* — Kien C Ly
(74) *Attorney, Agent, or Firm* — Murphy, Bilak & Homiller, PLLC

(57) ABSTRACT

In an embodiment, a module includes a first electronic device in a first device region and a second electronic device in a second device region. The first electronic device is operably coupled to the second electronic device to form a circuit. Side faces of the first electronic device and of the second electronic device are embedded in, and in direct contact with, a first epoxy layer.

12 Claims, 10 Drawing Sheets

(51) Int. Cl.
  *H01L 21/48* (2006.01)
  *H01L 23/31* (2006.01)
  *H01L 25/16* (2006.01)
  *H01L 25/07* (2006.01)
  *H01L 23/29* (2006.01)
  *H01L 23/538* (2006.01)
  *H01L 21/78* (2006.01)
  *H01L 21/683* (2006.01)
  *H01L 27/088* (2006.01)

(52) U.S. Cl.
  CPC ............. *H01L 2221/68327* (2013.01); *H01L 2224/0231* (2013.01); *H01L 2224/0233* (2013.01); *H01L 2224/02381* (2013.01); *H01L 2224/04042* (2013.01); *H01L 2224/05553* (2013.01); *H01L 2224/05647* (2013.01); *H01L 2224/0603* (2013.01); *H01L 2224/06182* (2013.01); *H01L 2224/08137* (2013.01); *H01L 2224/245* (2013.01); *H01L 2224/24105* (2013.01); *H01L 2224/24137* (2013.01); *H01L 2224/2518* (2013.01); *H01L 2224/48247* (2013.01); *H01L 2224/49175* (2013.01); *H01L 2224/73227* (2013.01); *H01L 2924/13055* (2013.01); *H01L 2924/13091* (2013.01)

(56) References Cited

U.S. PATENT DOCUMENTS

| | | | |
|---|---|---|---|
| 2013/0134559 A1* | 5/2013 | Lin | H01L 23/147 257/620 |
| 2013/0140673 A1 | 6/2013 | Haeberlen et al. | |
| 2015/0221523 A1 | 8/2015 | Zundel et al. | |
| 2015/0318261 A1 | 11/2015 | Chung et al. | |
| 2016/0225717 A1* | 8/2016 | Palm | H01L 23/5386 |
| 2017/0309518 A1* | 10/2017 | Uzoh | H01L 24/92 |

* cited by examiner

SEMICONDUCTOR MODULE, ELECTRONIC COMPONENT AND METHOD OF MANUFACTURING A SEMICONDUCTOR MODULE

BACKGROUND

In some circuits, such as power conversion, the circuit requires two or more semiconductor devices which are electrically coupled together to provide the corresponding circuit or part of the corresponding circuit. For example, in motor drivers, DC/DC converters and rectifiers, the circuit may require combination of transistor devices which are used as a switch in a half bridge configuration that includes a low side switch and a high side switch. In a half bridge configuration, the drain of the transistor device providing the low side switch is electrically coupled to the source of the transistor providing the high side switch.

In some embodiments, each semiconductor device, for example, a transistor device, is accommodated within a package and the packages are electrically coupled together by means of a conductive redistribution structure positioned external to the packages. For example, the packages may be mounted on circuit board including a conductive redistribution structure which electrically couples the packages to form the circuit or part of the circuit. Such an arrangement may, however, occupy an undesirably large lateral area for some applications.

US 2013/014 0673 A1 discloses a semiconductor device including one semiconductor die in which a first field effect transistor and a second field effect transistor are monolithic integrated and form a half bridge configuration.

Methods for fabricating a device including two or more semiconductor devices which are electrically coupled to form a circuit are desirable.

SUMMARY

In an embodiment, a module comprises a first electronic device in a first device region and a second electronic device in a second device region, wherein the first electronic device is operably coupled to the second electronic device to form a circuit. The module further comprises a first major surface comprising at least one contact pad, a second major surface comprising at least one contact pad, the second major surface opposing the first major surface, a first epoxy layer arranged on the first major surface that leaves at least portions of the first contact pad exposed. Side faces of the first electronic device and of the second electronic device are embedded in, and in direct contact with, the first epoxy layer. The module further comprises a conductive redistribution structure that electrically couples the first electronic device with the second electronic device to form the circuit. The conductive redistribution structure comprises a conductive via extending from the first major surface to the second major surface and a conductive layer that is arranged on the conductive via and on at least one of the first device region and on the second device region.

In an embodiment, an electronic component comprises a module according to any one of the embodiments described herein, a plurality of leads and a plastic housing composition. The first contact pad of the module is coupled to a first lead and the second contact pad of the module is coupled to a second lead of the plurality of leads. The plastic housing composition covers the first epoxy layer.

In an embodiment, a method for manufacturing a semiconductor module comprises forming at least one trench in non-device regions of a first surface of a semiconductor wafer and forming at least one trench in non-circuit regions the first surface of the semiconductor wafer. The non-device regions are arranged between component positions and the component positions comprising at least two semiconductor devices for forming a circuit. A non-circuit region is arranged between a first device region comprising a first electronic device and a second device region comprising a second electronic device, a first metallization layer being arranged on the first surface in the first device region and in the second device region. The method further comprises applying a first polymer layer to the first surface of a semiconductor wafer such that the trenches, edge regions of the component positions, edge regions of the first device regions and edge regions of the second device regions are covered with the first polymer layer, removing portions of a second surface of the semiconductor wafer, the second surface opposing the first surface, revealing portions of the first polymer layer in the non-device regions and in the non-circuit regions and producing a worked second surface. The method further comprises applying a second metallization layer to the worked second surface and operably coupling the first electronic device to the second electronic device to form the circuit and inserting a separation line through the first polymer layer in the non-device regions to form a plurality of separate semiconductor dies comprising the circuit.

Those skilled in the art will recognize additional features and advantages upon reading the following detailed description, and upon viewing the accompanying drawings.

BRIEF DESCRIPTION OF THE FIGURES

The elements of the drawings are not necessarily to scale relative to each other. Like reference numerals designate corresponding similar parts. The features of the various illustrated embodiments can be combined unless they exclude each other. Exemplary embodiments are depicted in the drawings and are detailed in the description which follows.

DETAILED DESCRIPTION

Figure 1:
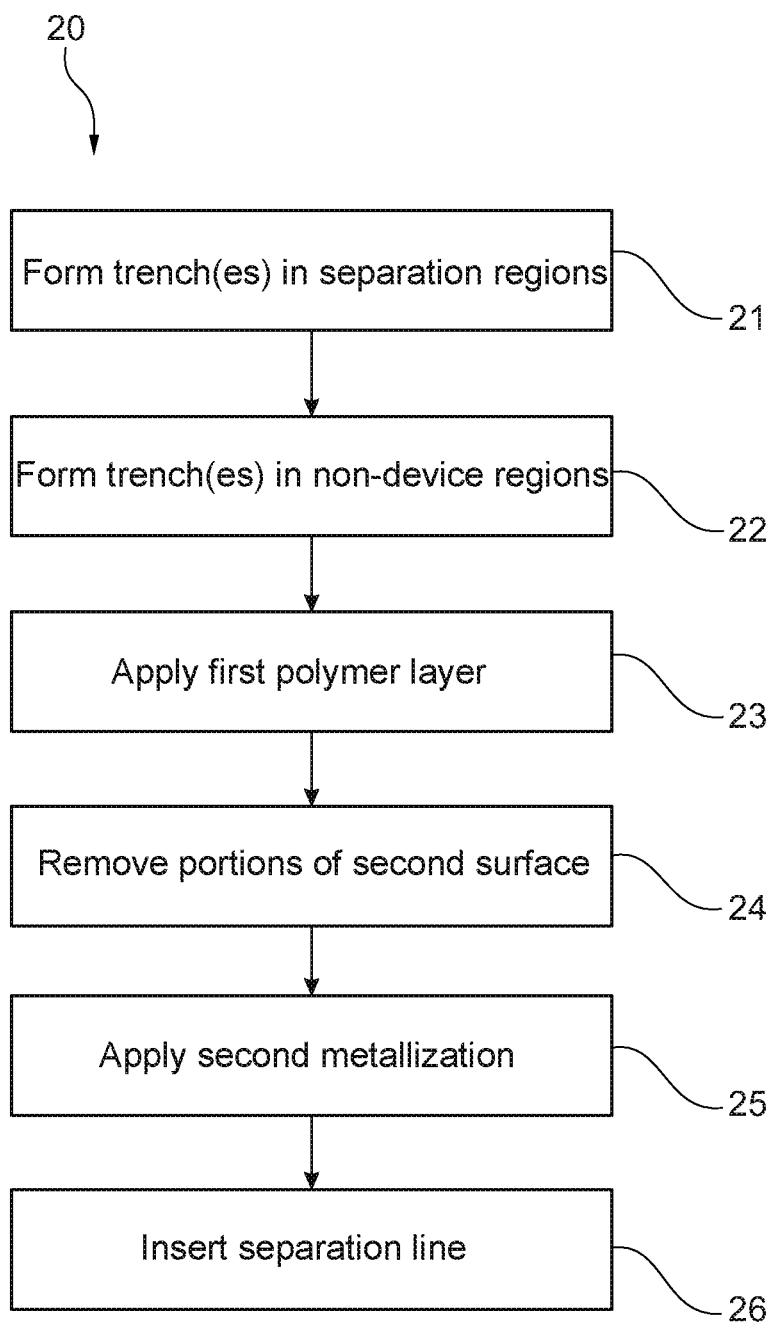
FIG. 1 illustrates a flow diagram of a method for fabricating a semiconductor module.

In the following detailed description, reference is made to the accompanying drawings, which form a part hereof, and in which is shown by way of illustration specific embodiments in which the invention may be practiced. In this regard, directional terminology, such as "top", "bottom", "front", "back", "leading", "trailing", etc., is used with reference to the orientation of the figure(s) being described. Because components of the embodiments can be positioned in a number of different orientations, the directional terminology is used for purposes of illustration and is in no way limiting. It is to be understood that other embodiments may be utilized and structural or logical changes may be made without departing from the scope of the present invention. The following detailed description, thereof, is not to be taken in a limiting sense, and the scope of the present invention is defined by the appended claims.

A number of exemplary embodiments will be explained below. In this case, identical structural features are identified by identical or similar reference symbols in the figures. In the context of the present description, "lateral" or "lateral direction" should be understood to mean a direction or extent that runs generally parallel to the lateral extent of a semiconductor material or semiconductor carrier. The lateral direction thus extends generally parallel to these surfaces or sides. In contrast thereto, the term "vertical" or "vertical direction" is understood to mean a direction that runs generally perpendicular to these surfaces or sides and thus to the lateral direction. The vertical direction therefore runs in the thickness direction of the semiconductor material or semiconductor carrier.

As employed in this specification, when an element such as a layer, region or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present.

As employed in this specification, when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

In power conversion applications, the corresponding circuits commonly require a combination of transistors, such as Field Effect Transistors (FETs), to form, for example the high- and low-side of a buck converter, to be positioned as close as possible within a single package. With the use of individual chips, this may pose practical issues requiring relatively larger distances between chips which may contribute additional stray inductivities. The individual placing of chips also requires minimum spacing distances which limits the possible shrink of the package. Wider spacings may increase stray inductivities which impact the performance of the package.

The embodiments described herein include a multi-chip or multi-device single die module that enables closer spacing of chips and simultaneously allows a direct electrical connection between source and drain by means of a via, for example a through silicon via (TSV). The module can be packaged in standard plastic packages or is ready for chip embedding.

FIG. 1 illustrates a flow diagram 20 of a method for fabricating a semiconductor module which includes a first electronic device and a second electronic device which are coupled to form a circuit. In block 21, at least one trench is formed in separation regions of a first surface of a semiconductor wafer. In block 22, at least one trench is formed in non-device regions of the first surface of the semiconductor wafer. The separation regions are arranged between component positions of the semiconductor wafer. The component positions may each comprise at least two electronic devices for forming a circuit and a non-device region arranged between a first device region comprising a first electronic device and a second device region comprising a second electronic device. A first metallization structure is arranged on the first surface of the semiconductor wafer in the first device region and in the second device region.

In block 23, a first polymer layer is applied to the first surface of the semiconductor wafer such that the trenches in both the separation regions and the non-device regions, edge regions of the component positions, edge regions of the first device regions and edge regions of the second device regions are covered with the first polymer layer. The polymer layer may include a curable polymer composition, such as a thermosetting polymer resin and may include epoxy.

In block 24, portions of a second surface of the semiconductor wafer, the second surface opposing the first surface, are removed and portions of the first polymer layer positioned in the separation regions and in the non-device regions are exposed and a worked second surface is produced.

The thickness of the semiconductor wafer is reduced and may be reduced to a predetermined thickness. In these embodiments, the depth of the trenches in the separation regions and in the non-device regions may be selected to be greater than the desired final thickness of the semiconductor wafer, such that portions of the first polymer layer arranged in the trenches formed in the separation regions and in the non-device regions are exposed after the thickness of the semiconductor wafer has been reduced to the predetermined desired thickness.

In block 25, a second metallization layer is applied to the worked second surface. The first electronic device is operably coupled to the second electronic device to form the desired circuit.

In block 26, a separation line is inserted through the first polymer layer positioned in the separation regions to form a plurality of separate semiconductor modules, each semiconductor module comprising the circuit. Each semiconductor module includes the first electronic device and the second electronic device which are operably coupled to form the circuit. The separation line may be inserted by mechanical sawing or laser cutting, for example.

The semiconductor module includes two device regions comprising semiconductor material. The semiconductor material may be silicon, for example. Each semiconductor module includes two or more electronic devices which are laterally separated from one another by the portion of the first polymer layer arranged in the non-device region which is laterally positioned between the first device region comprising the first electronic device and the second device region comprising the second electronic device. The sidewalls of the module and edges formed between the sidewalls and the first surface and the second surface of the device regions may be covered and in direct contact with the first polymer layer. The first polymer layer may be used to protect the side faces and edges. This arrangement may be used to simplify handling of the module using automated equipment.

The module may be subsequently packaged and the exposed portions of the first and second metallization layers provide contact pads which may be electrically coupled to the external contact pads of the package by an internal conductive redistribution structure. In some embodiments, the module may be used in a circuit or application without being further packaged.

As an example, the first electronic device may include a transistor device, for example a field effect transistor device such as a MOSFET or insulated gate bipolar transistor (IGBT). The second electronic device may also comprise a transistor device, for example a field effect transistor device such as a MOSFET or insulated gate bipolar transistor (IGBT), or may include a driver device, such as a gate driver device, or part of a gate driver device, such as a pull-down FET (Field Effect Transistor), or may include a passive device, such as an inductor, a capacitor, or a resistor. If two transistor devices are provided, the module may provide a half bridge circuit with appropriate electrical connections between the two transistor devices.

In some embodiments, each component position may comprise more than two electronic devices for forming a particular circuit. As an example, the circuit may be half bridge configuration in the case of both the first electronic device and the second electronic device being a transistor and the component position may further include a driver device, or part of a driver device, such as a pull-down FET, that is coupled to the gates of the two transistor devices.

The non-device regions do not include any device structures and may laterally surround the first device region and the second device region. The separation regions which are positioned between immediately adjacent component positions are typically also free of device structures. In some embodiments, the component positions are arranged in a regular array of rows and columns such that the trenches formed in the separation regions have the form of a square or rectangular grid in plan view.

The device regions in each component position may have different lateral arrangements. In some embodiments, the device regions within each electronic component position are arranged laterally adjacent one another, such that the trenches formed in the non-device regions extend substantially parallel to one another. In some embodiments, the device regions within each electronic component position are arranged laterally such that one device region is separated from the other device region by two substantially perpendicular non-device regions and such that the trenches formed in the non-device regions extend substantially perpendicular to one another. For example, one device region may be arranged in a corner of a laterally square or rectangular component position such that it is bounded by two substantially perpendicular separation regions and by two substantially perpendicular non-device regions. The other device region may have an L-shape. In some embodiments, one device region is laterally surrounded in all sides by a further device region such that a non-device region having a continuous ring-form surrounds the inner device region. For example, an inner device region may be substantially square or rectangular and be laterally surrounded by a substantially square or rectangular continuous non-device region which in turn is laterally surrounded by a square or rectangular ring-shaped further device region. The inner device region and the outer device region may be concentric or non-concentrically arranged with respect to one another.

In some embodiments, in block 25, the second metallization layer is applied such that it operably couples, for example electrically connects, the first electronic device to the second electronic device to form the circuit. In other embodiments, the first electronic device and the second electronic device may be electrically connected by the first metallization structure and the removal of portions of the second surface of the semiconductor wafer results in the semiconductor body of the two electronic devices being electrically insulated from one another. The second metallization layer may provide a ground plane in these embodiments.

In some embodiments, the method further comprises forming a vertical conductive connection that extends between the first and second surfaces of the wafer. The vertical conductive connection may be used to electrically couple the first and second electronic devices. A vertical conductive connection may be used if one or more of the electronic devices is a vertical device having a vertical drift path, for example.

In some embodiments, the method further comprises inserting one or more vias or through-holes into the first device region or the second device region, inserting conductive material into the via and electrically coupling the conductive material within the via to the first electronic device and to the second electronic device. In some embodiments, a via may be inserted into both the first device region and the second device region. In some embodiments, two or more vias may be inserted into at least one of the first device region and the second device region. The number and position of the vias may be selected depending on the circuit which is to be formed, the structure of the first and second electronic devices and on the current carrying capacity required by the via structure.

The via may be inserted into the first surface of the semiconductor wafer and, afterwards, the first metallization structure and the first polymer layer is applied to the first surface and subsequently, portions of the second surface of the semiconductor wafer are removed to form the worked second surface. Alternatively the via may be inserted into the first surface of the semiconductor wafer before the first metallization structure is applied.

An insulating material may be inserted into the one or more vias or through-holes formed in the first device region or the second device region before the conductive material is inserted into the via. The insulating material may line the side walls of the via or through-hole and contain insulation to the surrounding device body.

In some embodiments, a further conductive layer is applied to the first metallization structure, for example, to increase the thickness of the regions which are to provide the contact pads. The conductive material may be inserted into the via before the further conductive layer is applied such that this further conductive layer electrically couples the conductive material within the via to the first metallization structure. Alternatively, the conductive material can be inserted into the via and a further conductive layer applied to one or both of the major surfaces in the same deposition process.

In some embodiments, the via is inserted into the worked second surface of the semiconductor wafer. In these embodiments, the via may be inserted such that the base of the via is formed by a portion of the first metallization structure or further conductive layer positioned on the first surface of the semiconductor wafer. The conductive material is inserted into the via such that it makes contact with and is electrically connected to the first metallization structure. The conductive material may be electrically insulated from the surrounding device body by insulation material that lines the side walls of the via.

The second metallization layer may be applied to the worked second surface and to the conductive material within the via in order to electrically couple the first electronic device arranged in the first device region to the conductive via and to the second electronic device positioned in the second device region. The second metallization layer may extend from the first device region over the non-device region including the first polymer layer which is exposed in the worked second surface, onto the second device region and onto the conductive material positioned within the via. The second metallization layer may also be structured in order to form one or more contact areas on the worked second surface of the semiconductor wafer that are electrically separated from a further conductive area, for example, the conductive area electrically coupling the first electronic device to the conductive via.

In these embodiments, a vertical portion of the redistribution structure of the module is formed which is positioned within the semiconductor material of the semiconductor wafer, either within the first device region or within the second device region.

In other embodiments, this vertical portion of the redistribution structure may be positioned between the first and second device regions and be positioned in the non-device region. In some embodiments, the method further includes inserting conductive material into the trench formed in the non-device region and electrically coupling the conductive material positioned within this trench to the first electronic device and to the second electronic device. The conductive material within the via may be electrically coupled to the first electronic device and to the second electronic device by portions of the first metallization layer arranged on the first surface and by portions of the second metallization layer arranged on the second surface.

The conductive material arranged in the trench in the non-device region may be electrically insulated from the semiconductor material of the first and second device regions by applying one or more insulating layers to the sidewalls of the trench. In some embodiments, after the first polymer layer is inserted into the trench formed in the non-device region, a via is formed in the first polymer layer in the non-device regions. The via may have a width which is less than the width of the trench such that side faces of the first device region and of the second device region bounding the via are covered with the first polymer layer. The conductive material is applied to the first polymer layer in the via. The first polymer layer is, therefore, used to electrically insulate the conductive material from the side faces of the first and second device regions.

In some embodiments, the portions of the second surface of the wafer are subsequently removed exposing not only the first polymer layer arranged in the non-device regions but also the conductive material arranged within the non-device region in the worked second surface such that the conductive material extends from the first metallization surface structure arranged on the first surface of the second device region to the worked second surface.

The second metallization layer may be applied to the conductive material within the via arranged in the non-device region to electrically couple the first electronic device to the second electronic device. The second metallization layer may be applied such that it extends from the first device region over the non-device region to the second device region. In the case of via being positioned in the non-device region, the lateral extension of the second metallization layer onto both the first and the second device regions may be used to assist mechanical stability of the structure.

In some embodiments, a conductive via from the first surface of the semiconductor wafer to the worked second surface of the semiconductor wafer is formed by a conductive portion of the first device region or of the second device region. The conductive portion extends from the first surface of the semiconductor wafer to the worked second surface of the semiconductor wafer. The conductive portion may be insulated from the remainder of the semiconductor material of the first device region and second device region by an insulation layer, for example an oxide or nitride and/or by the first polymer layer. The conductive portion may be coupled to the first electronic device and second electronic device by a portion of the first and second metallization layers in order to electrically couple the first and second electronic devices and form the circuit.

The first polymer layer may be applied to the first surface of the semiconductor wafer such that at least a portion of the first metallization structure is uncovered by the first polymer layer. In some embodiments, the first polymer layer may be selectively applied such that it is applied to the trenches, edge regions of the component positions and edge regions of the first device regions and of the second device regions or may be applied as a closed layer, and portions of the first polymer layer removed to expose at least portion of the first metallization structure.

In some embodiments, the first polymer layer is laterally arranged such that peripheral portions of the first metallization structure are covered by the first polymer layer and bound exposed portions of the first metallization structure, for example bound and define one or more contact pads. In these embodiments, the first polymer layer may act to control the lateral extent of solder applied to the contact pads.

In some embodiments, the method further comprises applying a carrier to the first polymer layer arranged on the first surface, the first polymer layer being structured such that a least first portion of the first metallization structure is exposed by the first polymer layer. Cavities may be formed between the carrier and the first metallization structure which are bounded by the first polymer layer. The portions of the second surface of the semiconductor wafer are then removed and portions of the first polymer layer in the separation regions and in the non-device regions revealed whilst the carrier is applied to the first polymer layer. The carrier is not in direct contact with the first metallization structure of the semiconductor wafer.

The separation line, for example sawing line, may have a width that is less than the width of the trench in the separation regions. The separation line may then be inserted into the separation region such that at least portions of the side faces of the plurality of separate semiconductor modules comprise a portion of the first polymer layer.

In some embodiments, a second polymer layer is applied to the worked second surface in the separation regions and non-device regions, the side faces of the separate semiconductor modules may also comprise of a portion of the second polymer layer as well as the first polymer layer. The entire side faces as well as edges of the component positions may be covered by the first and second polymer layers.

The second polymer layer may also comprise a curable polymer composition, for example a thermosetting resin, for example, for example a second epoxy layer. The second polymer layer may be applied to the worked second surface such that it covers at least the first polymer layer arranged on the separation regions. The second polymer layer may also cover at least portions of the second metallization layer. In some embodiments, the second polymer layer covers peripheral regions of discrete portions of the second metallization layer and defines one or more contact pads which may be connected to a further conductive surface by solder.

In some embodiments, the second metallization layer includes a portion which extends from the first device region to the second device region and which extends over the non-device region which may comprise the first polymer layer. In some embodiments, the second polymer layer may abut this device connection portion of the second metallization layer or may cover peripheral edge regions of this portion of the second metallization layer and define a contact pad which is exposed from the second polymer layer. In other embodiments, this device connection portion of the second metallization layer may be entirely covered by the second polymer layer which provides electrical insulation of this portion of the metallization layer. This arrangement may be used if an electrical contact directly to this portion of the second metallization layer is not required or in embodiments in which electrical insulation of this portion of the layer and circuit is desirable or required.

In some embodiments, the second metallization layer may be applied by applying a conductive seed layer to the worked second surface, applying a second polymer layer to the seed layer such that at least portions of the seed layer are exposed from the second polymer layer, and applying a conductive layer to the exposed portions of the seed layer. The seed layer may be applied using vacuum deposition techniques, such as sputtering or chemical vapour deposition. The conductive layer may be applied to the seed layer using electrodeposition techniques, such as electroless deposition or galvanic deposition.

The conductive seed layer may be applied to the worked second surface such that the first polymer layer arranged in the separation regions and in the non-device regions and semiconductor material of the first and second device regions are covered by the seed layer. The second epoxy layer may be applied to the seed layer such that the separation regions are covered by the second polymer layer and such that regions of the worked second surface comprising semiconductor material and the first polymer layer arranged in the non-device regions are uncovered by the second polymer layer. The conductive layer is than applied to the seed layer in the portions uncovered by the second polymer layer in order to form the second metallization layer.

At least two devices are fabricated on the wafer so that the distances between chips can be reduced and are limited only by separation processes, for example 10-50 μm for mechanical half-cut dicing or plasma half-cut dicing. The multi-chip die is encapsulated in epoxy and only the corresponding connections are open metallic surfaces, for example copper surfaces. With the help of a via, direct connection between front side 1 (source1) and back-side 2 (drain2) of different chips are possible. Due to the encapsulated nature of the multi-chip die it can be directly picked and placed in standard packages like QFN or in chip embedding approaches.

Different types of devices may be processed next to each other on a silicon wafer. Once the processing of the front-side of the chips has been completed, a half-cut process step is performed. Here, the individual chips or devices are isolated from each other. At the same time the lines for separation between the individual multi-chip dies or multi-device modules are also half-cut. Following a dice-before-grind-with-epoxy process, the chips and half-cut lines (depth of half-cut~wafer target thickness+10 um) are covered and filled with epoxy. The copper pads on the front side are then opened in a lithography step making use of the corresponding epoxy properties. After mounting the wafer on a glass carrier, the wafer is thinned to its desired thickness, for example 15-20 μm. In the thinning process the epoxy filled half-cuts are exposed on the backside. Now a Copper back-side is deposited. This may be achieved by a sputtered Ti/Cu seed layer that is brought to a final thickness via electrodeposition of copper. Depending on the thickness also only sputtering is possible. Afterwards, the copper backside is structured in a manner that the multi-chip dies are connected to form the intended circuit.

The silicon through via can thereby be formed from the front-side before the half-cut dicing or from the back-side before the seed layer deposition. After the Cu backside structuring the complete backside is covered with epoxy again and the intended copper pads are opened in a lithography step making use of the corresponding epoxy properties. After the curing of the epoxy, the wafer is frame-demounted and the multi-chip dies are separated by a laser cut through the epoxy. Now the multi-chip dies can be picked in a standard manner from a dicing foil to be placed in standard packages.

Alternatively, both the copper front-side and copper-backside contacts and the silicon through via can be formed by using the corresponding front- and backside epoxy as a pattern plating mask on the pre-structured seed layer. This is achieved with the help of electroless plating. In this way the silicon through via can be integrated in a preexisting process flow.

The concept can be applied straight forwardly to integrate passive components like capacitors or inductors if they are formed on part of the wafer next to the corresponding connection chips. These passive components are treated like additional chips or as a part of one of the multi-chip system. Integration of these passive components may be of interest in integrated solutions since it allows the minimization of loop inductances and stray passive component contributions. This directly improves the performance of the solution and allows better control of overshoot behavior.

Figure 2:
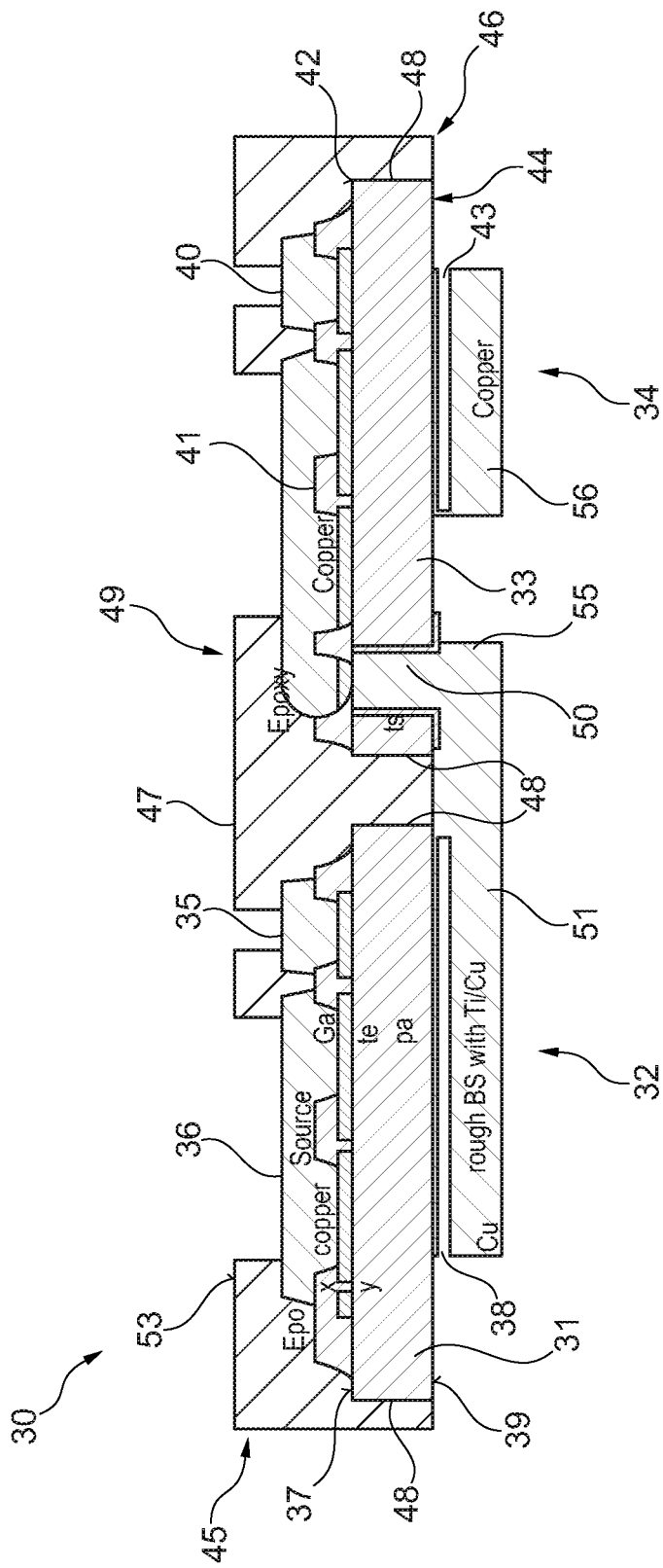
FIG. 2 illustrates a schematic cross-sectional view of a semiconductor module.

FIG. 2 illustrates a schematic cross-sectional view of a semiconductor module 30. The semiconductor module 30 includes a first electronic device 31 in a first device region 32 and a second electronic device 33 in a second device region 34. The first electronic device 31 is operably connected to the second electronic device 33 to form a circuit. In the illustrated embodiment, the first electronic device 31 is a transistor device, in particular a vertical transistor device, having a gate pad 35 and source pad 36 on a first surface 37 and a drain pad 38 on a second surface 39 which opposes the first surface 37. The second electronic device 33 is also a transistor device, in particular a vertical transistor device having a gate pad 40 and source pad 41 on a first surface 42 and a drain pad 43 on a second surface 44 that opposes the first surface 42. The first surface 42 of the second electronic component 33 is substantially coplanar with the first surface 37 of the first electronic component 31 and the second surface 44 of the second electronic component 33 is substantially coplanar with the second surface 39 of the first electronic component 31.

The module 30 has a first major surface 45 which includes at least one contact pad. In the embodiment illustrated in FIG. 2, the first major surface 45 includes four contact pads which are coupled to the source pad 36 and gate pad 35 of the first electronic device 31 and to the gate pad 40 and source pad 41 of the second electronic device 33. The semiconductor module 30 also includes a second major surface 46 that opposes the first major surface 45. The semiconductor module 30 includes a first polymer layer 47, in particular, a first epoxy layer, that is arranged on the first major surface 45 and which leaves at least portions of the contact pads 35, 36, 40, 41 exposed.

The first polymer layer 47 may be arranged on peripheral regions of the contact pads 35, 36, 40, 41. The first polymer layer 47 covers side faces 48 of the first electronic device 31 and the second electronic device 33 such that the first electronic device and the second electronic device 33 can be considered to be embedded in the first polymer layer 47. The semiconductor module 30 also includes a conductive redistribution structure 49 that electrically couples the first electronic device 31 to the second electronic device 33.

In this embodiment, the conductive redistribution structure 49 includes a conductive via 50 which extends from the first major surface 45 to the second major surface 46 of the semiconductor module 30. The conductive via 50 may be positioned in with the first device area 32 or in the second device area 34 and may be called a through silicon via. The conductive via 50 may be electrically insulated from the semiconductor material of the electronic device by an insulation layer 55. The via 50 provides an electrically conductive connection from the first major surface 45 to the second major surface 46 of the module and from the first surface 42 of the second electronic device 33 to the second surface 39 of the first electronic device 32. The redistribution structure 49 further includes a conductive layer 51 that extends laterally on the second major surface 46 of the module and is arranged on the via 50 formed in the second electronic device 33.

The conductive layer 51 is arranged on the conductive via 50 and on a portion of the first polymer layer 47 which forms part of the second major surface 46. The conductive layer 51 extends from the drain pad 38 of the first electronic device 31 to the conductive via 50 and is positioned not only on the first electronic device 31 and a portion of the first polymer layer 47 but also on a portion of the second major surface 44 of the second electronic component 33.

The conductive via 50 may extend between the source pad 41 and the second surface 44 of the second electronic component 33 and be electrically coupled to the source pad 41. The conductive layer 51 in combination with the conductive via 50 provides a redistribution structure 49 from the source pad 41 of the second electronic device 33 to the drain pad 38 of the first electronic device 31. In this particular embodiment, this arrangement can be used to form a half bridge configuration in which the first electronic component 31 is the low side switch of the half bridge configuration and the second electronic device 33 is the high side switch of the half bridge configuration.

A further conductive layer 56 may be arranged on the drain pad 43 of the second electronic device 33 such that the outer surfaces of the further conductive layers 51, 56 are substantially coplanar.

The conductive layer 51 that extends from the second surface 39 of the first electronic device 31 onto the second surface 44 of the second electronic device 33 is electrically insulated from further conductive portions arranged on the second surface 44 of the second electronic device 33, such as the contact pad 56, and from the body of the second electronic device 33 by the insulating layer 55. The insulating layer 55 lines the side walls of the via 50 and extends over and is arranged directly on the second surface 44 of the second electronic device 33 in regions adjacent the via 50. The insulating layer 55 has a lateral extent such that it is positioned between the second surface 44 and the conductive layer 51 and electrically insulates the conductive layer 51 from the second surface 44 and the second surface 44 of the second electronic device 33 from the second surface 39 of the first electronic device 31.

The module 30 may be fabricated using the method illustrated in FIG. 1 whereby the first electronic component 31 is formed from the first device region and the second electronic component 33 is formed from the second device region of the semiconductor wafer. The region between adjoining side faces 48 of the first and second electronic components 31, 33 is the non-device region of the component position of the semiconductor wafer. The outermost surface 53 of the semiconductor module 30 is formed by portions of the first polymer layer 47 which are formed by insertion of the separation line in the separation regions of the semiconductor wafer.

The semiconductor module 30 is formed from a semiconductor wafer by insertion of trenches and filling of the trenches with a first polymer layer which is arranged so as to embed at least the side faces of the electronic devices 31, 33 in the first polymer layer 47. The first polymer layer 47 provides a mechanical matrix holding the electronic devices 31, 33 together. The conductive connection between the electronic devices 31, 33 to form the desired circuit, in the embodiment illustrated in FIG. 2, a half bridge configuration can be formed by deposition of conductive layers on the first and second major surfaces 45, 46 and in the case of one or more vertical devices, by the provision of one or more conductive vias 50 extending between the major surfaces 45, 46 of the semiconductor module 30.

The via 50 may be arranged in a device region. In the embodiment illustrated in FIG. 2, the via 50 is arranged in the second electronic component 33 and extends between the first surface 42 and second surface 44 of the second electronic component 33.

Figure 3A:
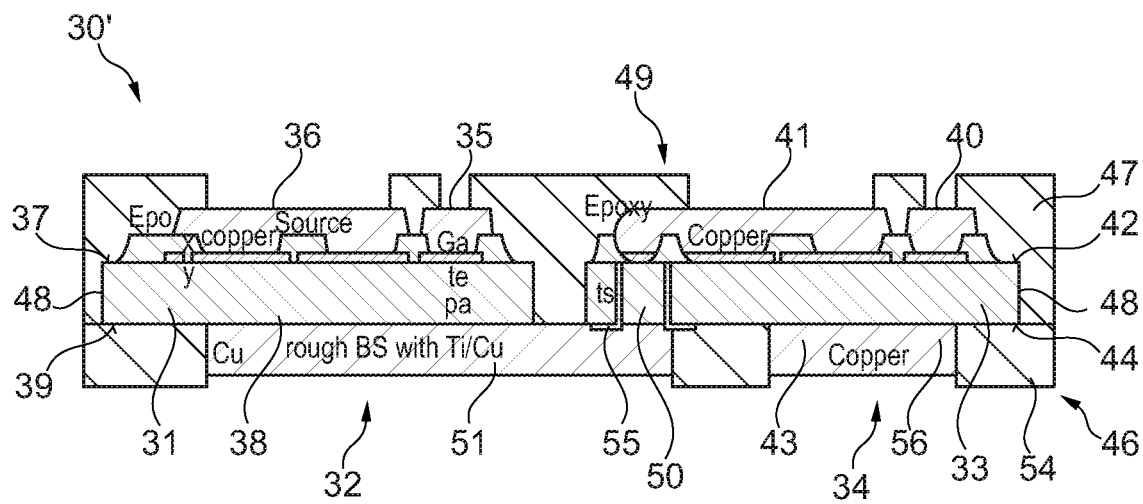
FIG. 3A illustrates a cross-sectional view of a semiconductor module including two polymer layers.
Figure 3B:
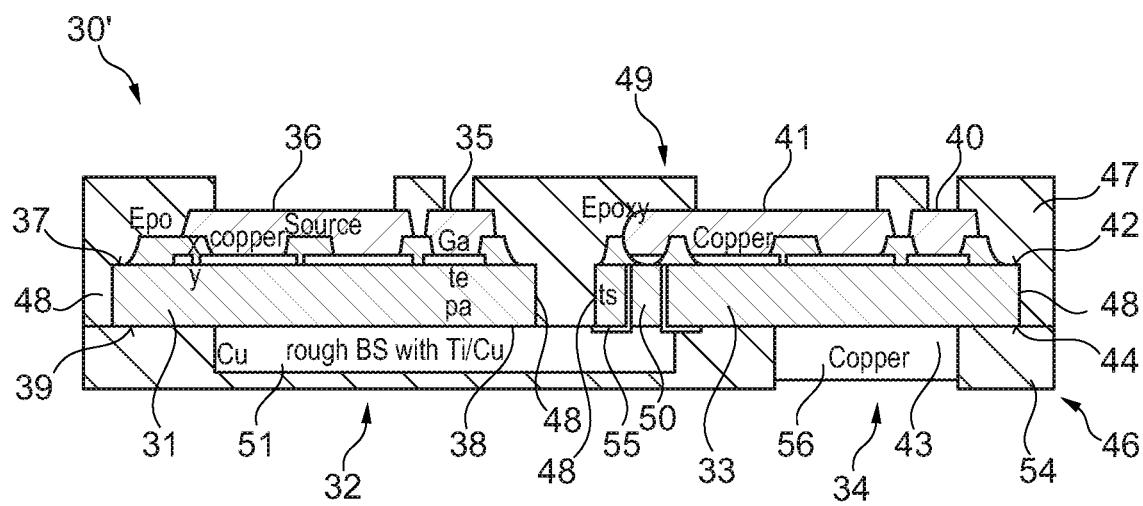
FIG. 3B illustrates a cross-sectional view of a semiconductor module including two polymer layers.

FIGS. 3A and 3B illustrate respective cross-sectional views of a semiconductor module 30' which in addition to the features illustrated in FIG. 2 further includes a second polymer layer 54 arranged on the second major surface 46 of the semiconductor module 30'. The second polymer layer 54 may also be a curable polymer, such as a thermosetting polymer composition and in some embodiments includes an epoxy resin.

In some embodiments, such as that illustrated in FIG. 3A, the second polymer layer 54 may be arranged at the peripheral edges of the semiconductor module 30' and be arranged in contact with portions of the first polymer layer 47 arranged adjacent the side faces 48 of the first electronic component 31 and of the second electronic component 33. The second polymer layer 54 may also be arranged between conductive regions of the second major surface 46 of the semiconductor module 30'. For example, in the embodiment illustrated in FIG. 3A, the second polymer layer is arranged between the further layer 51 and the drain pad 43. In some embodiments, the second epoxy layer 54 may cover the peripheral regions of the drain pad 43 and the conductive layer 51.

In some embodiments such as that illustrated in FIG. 3B, the conductive layer 51 is covered entirely by the second polymer layer 54 and at least a portion of the drain pad 43 remains uncovered by the second polymer layer 54.

In the embodiments illustrated in FIGS. 2 and 3, the first electronic device 31 and the second electronic device 33 is a transistor device and the circuit formed is a half bridge circuit. However, the types of electronic devices arranged in the first and second device regions of the semiconductor module are not limited to transistor devices. For example, one of the electronic devices may be a transistor device and the other of the electronic devices may be a driver device, for example a gate driver device, or part of a gate driver device such as a pull-down FET, for driving the gate of the transistor device, or a diode or passive device such as an inductor, a capacitor or a resistor. Furthermore, the module is not limited to including just two electronic devices and may include three or more electronic devices. For example, the module may include two transistor devices coupled to form half bridge circuit, and also a driver device, or part of a gate driver device such as a pull-down FET, for driving the gates of the two transistor devices.

As mentioned above, in embodiments in which the module includes a redistribution structure having a vertical portion extending between the first major surface and the second major surface of the module, the vertical portion may be provided by one or more conductive vias which are positioned in one or more of the electronic devices. In these embodiments, the sidewalls of the via are formed by the semiconductor material, for example silicon, of the electronic device. In other embodiments, the vertical portion of the redistribution structure may be positioned laterally adjacent the electronic devices.

Figure 4:
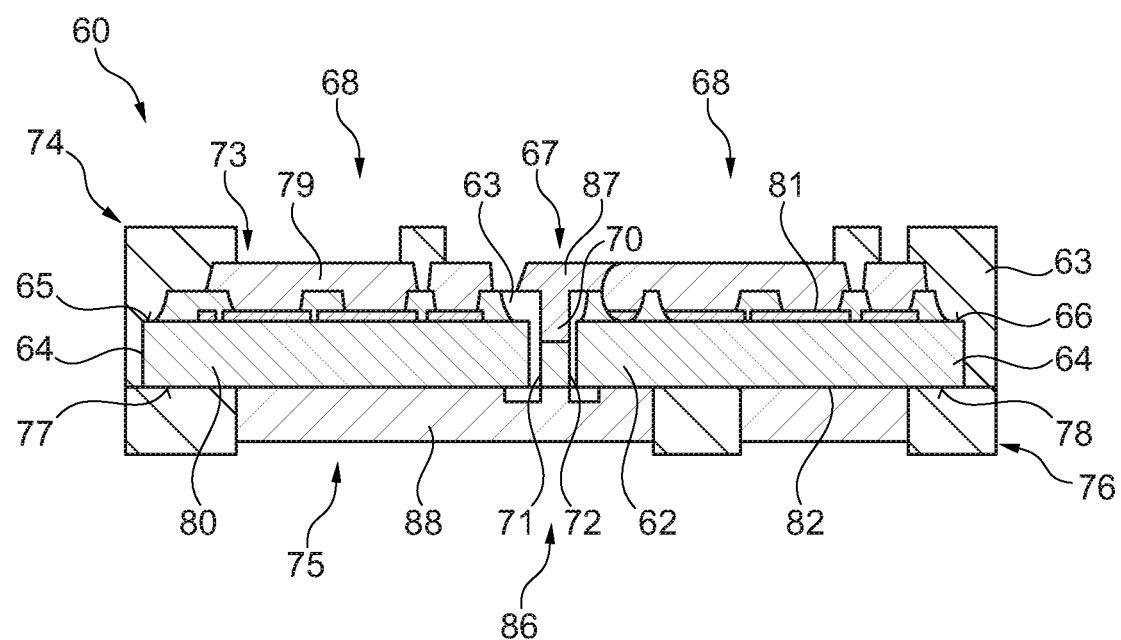
FIG. 4 illustrates a cross-sectional view of a semiconductor module.

FIG. 4 illustrates a module 60 which includes a first electronic device 61 and a second electronic device 62 arranged laterally adjacent each other and embedded in a first polymer layer 63 which covers at least portions of the side faces 64 of both the first electronic device 61 and second electronic device 62. In some embodiments, the first polymer layer 63 may cover peripheral regions and edges of a first major surface 65 of the first electronic device 61 and a first major surface 66 of the second electronic device 62 which is positioned laterally adjacent the first major surface 65 of the first electronic component 61 and may be substantially coplanar with the first major surface 65 of the first electronic component 61. The portion of the first polymer layer 63 arranged between the first electronic device 61 and second electronic device 62 may be described as a non-device region 67 with the first electronic device 61 being arranged in a first device region 68 and the second electronic device 62 being arranged in a second device region 69.

In this embodiment, a conductive via 70 is arranged in the non-device region 67. The conductive via 70 has sidewalls 71 formed by the material of the first polymer layer 63. The conductive via may have an elongate shape in plan view. The conductive via 70 may include conductive material, such as a metal, for example copper. In some embodiments, the side walls 71 defining the via 72 in the first polymer layer 63 may be lined with one or more metal layers which may be used to improve the adhesion to the material of the first polymer layer 63 as well as one or more conductive layers having a thickness suitable for carrying the current required by the particular application. In some embodiments, the via 72 may be substantially filled with conductive material.

The semiconductor module 60 also includes a first metallization structure 73 arranged at the first major surface 74 of the module 60. The first metallization layer 73 may include two or more conductive portions with one or more conductive portions being arranged on the first major surfaces 65, 66 of the first and second semiconductor devices 61, 62. Similarly, the semiconductor module 60 may include a second metallization layer 75 arranged at the second major surface 76 of the module 60 which is structured to provide one or more portions on the second surfaces 77, 78 of the first and second electronic devices 61, 62 respectively. The conductive via 70 may be electrically coupled to a portion of the first metallization structure 73, which extends from one of the electronic devices, for example, the second electronic device 62, to the conductive via 70. The conductive via 70 may be coupled to the other one of the electronic devices, for example the first electronic device 61, by a portion of the second metallization layer 75 arranged on the opposing side of the module 76 which extends between the first electronic device 61 and the conductive via 70.

In the case of the first and second electronic devices 61, 62 being transistor devices and the desired circuit being half bridge configurations, a portion of the second metallization structure 75 may extend from a drain pad positioned at the second surface 77 of the first electronic device 61 to the conductive via 70 and a portion of the first metallization layer 73 may extend from the conductive via 70 to a source pad arranged at the first major surface 66 of the second electronic device 62.

The portion of the second metallization structure 75 that extends from the second surface 77 of the first electronic device 61 onto the second surface 78 of the second electronic device 62 is electrically insulated from further portions of the second metallization structure 75 arranged on the second surface 78 of the second electronic device 62, such as the contact pad 82. This electrical insulation may be provided by an insulating layer 63 that lines the side walls of the via 70 and extends over and is arranged directly on the second surface 78 of the second electronic component 62 in regions adjacent the via 70. The portion of the second metallization structure 75 that is positioned on the second surface 78 of the second electronic device 62 is arranged on this insulation layer 63. The insulation layer 55 also serves to electrically insulate the second surface 78 of the second electronic device 62 from the second surface 77 of the first electronic device 61.

In other embodiments, the conductive layer 75 has a lateral extent such that it does not extend onto the semiconductor body of the first electronic device 61 and extends only to the conductive material in the via 70.

Figure 5:
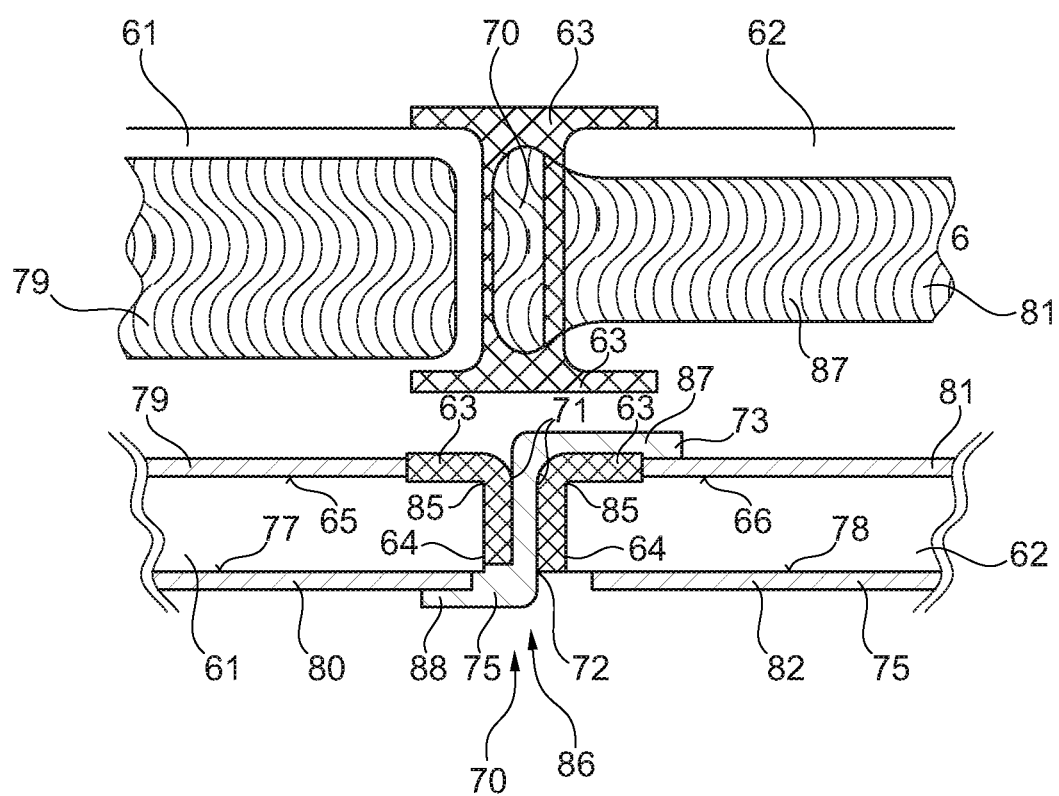
FIG. 5 illustrates an enlarged top view and an enlarged side view of the conductive via of the semiconductor module of FIG. 4.

FIG. 5 illustrates an enlarged top view and enlarged side view of the conductive via 70 in the semiconductor module 60. The first electronic component 61 includes a contact pad 79 on its first major surface 65 which, may be a source pad if the first electronic component is a transistor device for example, and a second contact pad 80 on its second major surface 77 which may be a drain pad for example. The second electronic component 62 also includes a contact pad 81 on its first major surface 66 and contact pad 82 on its second major surface 78. The contact pad 81 may be a source pad and the contact pad 82 may be a drain pad if the second electronic component is a transistor device. Each transistor device may also include a gate pad which cannot be seen in the views of FIG. 5. Edge regions 83 of the first electronic device 61 that are formed between the first major surface 65 and the side face 64 are covered by a portion 84 of the first polymer layer 63. The entire side face 64 of the first electronic component 61 may be covered by the first polymer layer 63. Similarly, the edge region 85 of the second electronic device 62 formed between the first major surface 66 and side face 64 may be covered by the first polymer layer 63. The first polymer layer 63 may abut the contact pads 79, 81 arranged on the first major surfaces 65, 66 of the first and second electronic devices 61, 62, respectively.

The redistribution structure 86 used to couple the contact pad 80 with the contact pad 81 arranged on the opposing sides of the module 60 may be formed by a conductive path which extends from the contact pad 80 through the via 72 to the contact pad 81 to electrically couple the drain of the first electronic device 61 to the source of the second electronic device 62. The redistribution structure 86 includes a via 72 formed in the first polymer layer 64 which extends substantially parallel to side faces 64 of the first and second electronic devices 61, 62. The via 72 may have sidewalls 71 which are roughened to improve the adhesion to the conductive material positioned within the via 72. The sidewalls 71 of the via 72 may also be a lined with one or more adhesion layers. The redistribution structure 86 may be formed using several portions. For example, the conductive via 72 extending through the first polymer layer 63 may be filled with conductive material and a lateral layer 87 applied to the upper surface of the via 70 which extends from the via 70 to the contact pad 81. A second lateral layer 88 may be applied to the opposing rear side of the module 60 which extends from the contact pad 80 to the lower surface of the conductive via 70. In other embodiments, a conductive layer may be applied which extends from the contact pad 81 into the via 72 and by a layer which extends from the contact pad 80 into the via 71 such that the two conductive layers join at a position in the via 72 adjacent the side faces 64 and a continuous conductive path is produced.

The semiconductor module according to any one of the embodiments described herein may be used to form a circuit by mounting the module onto a higher level substrate including a redistribution structure, for example a circuit board such as a printed circuit board. In other embodiments, the semiconductor module may be packaged. Packaging the semiconductor module enables the module to be provided in the form of a package with a standard footprint and standard outline which may assist in simplifying use of the module in particular application.

Figure 6:
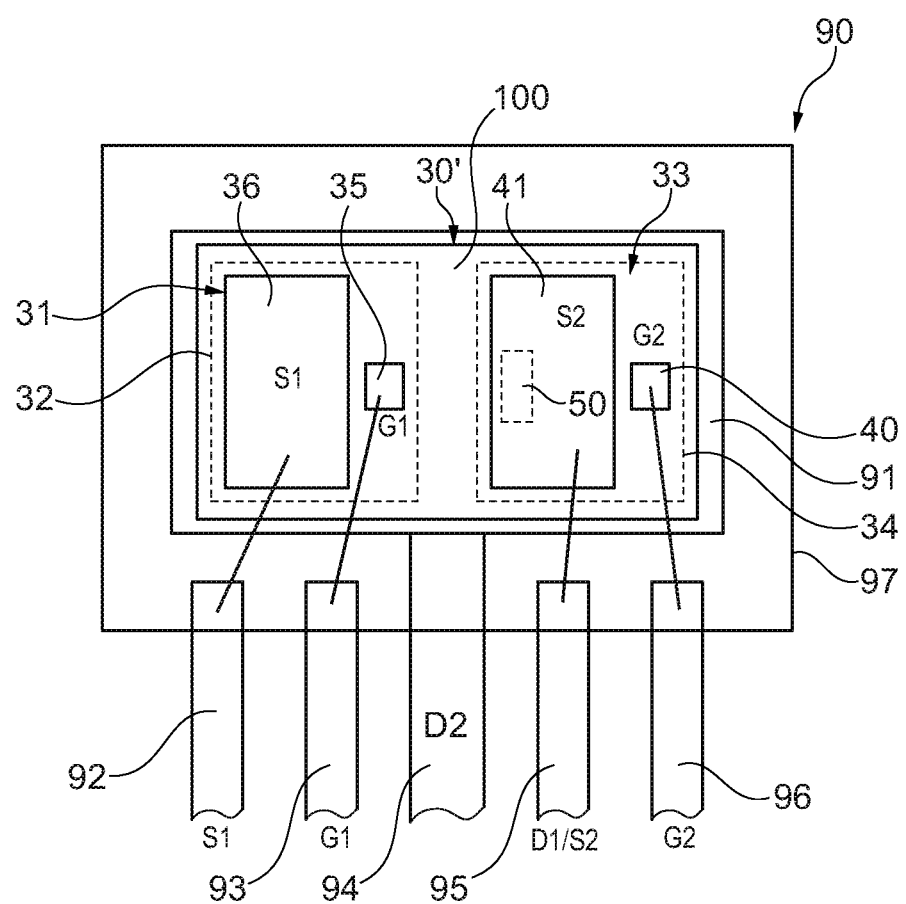
FIG. 6 illustrates a schematic view top view of the semiconductor module of FIGS. 3A-3B accommodated within a package.

FIG. 6 illustrates a schematic view top view of the semiconductor module 30' of FIG. 3B accommodated within a package 90. In the illustrated embodiment, the package 90 includes a die pad 91, five leads 92 to 96 and a plastic housing 97. The die pad 91 and inner portions of the leads 92 to 96 are positioned within the plastic housing 97. Portions of the leads 92 to 96 extend outside of plastic housing 97 and provide the external contact contacts to the package 90. In this embodiment, the leads 92 to 96 are positioned adjacent a single side of the die pad 91 with the central one of the five leads, lead 94, being integral with the die pad 91. The module 30' is mounted on the upper surface 98 of the die pad 91.

Since the drain pad 43 of the second electronic device 33 is exposed at the second major surface 46 of the semiconductor module 30' and the drain pad 38 of the electronic device 61, the further conductive layer 51 and conductive via 50 are covered by the second polymer layer 54, by mounting the second major surface 46 of the module 30' to the upper surface 98 of the die pad 90, the drain pad 43 of the second electronic device 33 may be electrically coupled to the die pad 91 and therefore the central lead 94. The pads 35, 36, 40, 41 arranged at the first major surface 45 of the module 30' face upwardly and may be electrically coupled to the leads 92, 93, 95, 96, which are spaced apart from the die pad 91, by conductive connections such as one or more bond wires, conductive ribbons or contact clips. The source pad 36 may be coupled to the first lead 92, the gate pad 35 may be coupled to the lead 93, the source pad 41 and the gate pad 40 of the second electronic device 33 may be coupled to the leads 95, 96 respectively.

Also illustrated in the top view of FIG. 6 is the non-device area 100 of the module 30'. The device areas 32, 34 are indicated by dashed lines. The conductive via 50 is positioned underneath the source pad 41 and is also indicated by a dashed line.

The package is not limited to one having the arrangement of die pad, leads, connections and housing illustrated in FIG. 6. For example, the package may be a Surface Mount Device, such as a Super SO8 package or QFN (Quad Flat No Lead) package. A contact clip may be used in place of bond wires for power connections, e.g. connections other than a connection to the gates, for example.

A method for fabricating a semiconductor module according some embodiments will now be described with reference to FIGS. 7A-7I.

Figure 7A:
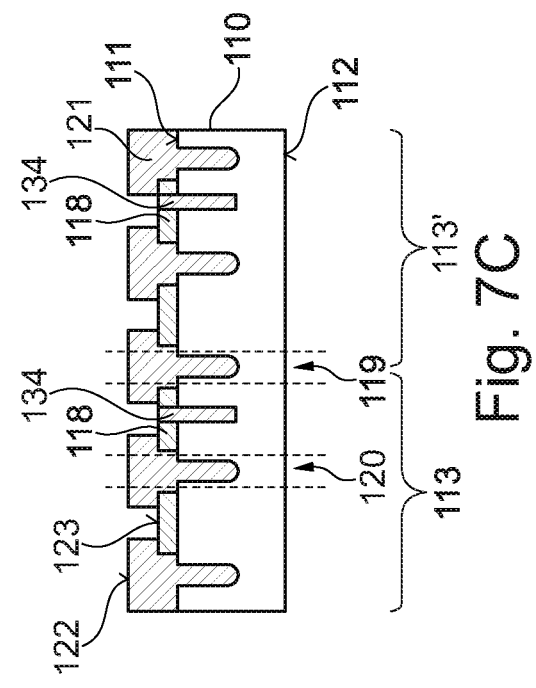
FIG. 7A illustrates a cross-sectional view of a semiconductor wafer.

FIG. 7A illustrates a cross-sectional view of a semiconductor wafer 110 including a first major surface 111 and a second major surface 112 which opposes the first major surface 111. The semiconductor wafer 110 includes a plurality of component positions of which two component positions 113, 113' are illustrated in FIGS. 7A-7I. Adjacent component positions are spaced apart from one another by a separation region 114.

The component positions 113 are typically arranged in rows and columns to form a regular grid such that the separation regions 114 provide have the form of substantially orthogonal stripes in plan view. Each component position 113 includes two or more device regions 115, 116 which are separated by a non-device region 117 which does not include any device structures. The wafer 110 also includes a first metallization structure 118 on its first major surface 111. The first metallization structure 118 may be structured so that it is positioned in only the device regions 115, 116 and such that the non-device region 117 is free from first metallization structure 118.

Figure 7B:
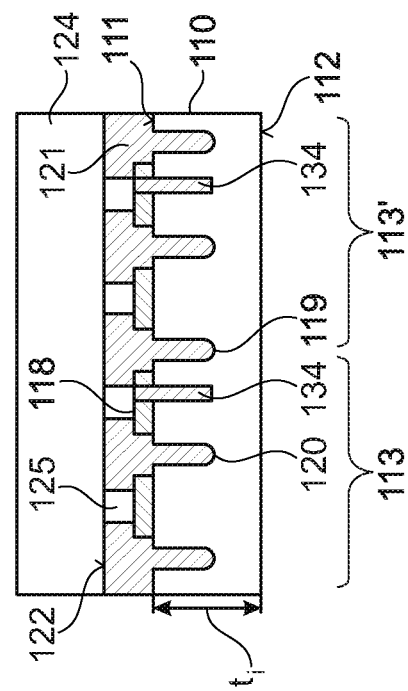
FIG. 7B illustrates the wafer after the formation of first trenches and second trenches in the first major surface of the wafer.

One of the device positions of the component position 113, for example the device regions 116, includes one or more conductive vias 134 which extends from the first metallization structure 118 into the wafer 110 to a depth. The conductive via 134 may have the form of a blind via 135 having a base positioned at a depth from the first major surface 111 which is greater than the predetermined final thickness of the electronic components as is illustrated in FIG. 7B. The blind via 135 may include insulation material (not seen in the figures) that covers at least the side walls of the blind via 135 and conductive material arranged on the insulation material. The conductive material may include one or more liner layers lining the side walls of the blind via and one or more further conductive materials on the liner layers. The conductive material may fill the remainder of the blind via 135. The conductive material may include one or more metals or alloys and/or polysilicon.

FIG. 7B illustrates the wafer 110 after the formation of first trenches 119 which have been inserted into the first major surface 111 in the separation regions 114 and after the formation of second trenches 120 which have been inserted into the first major surface 111 in the non-device regions 117. The trenches 119, 120 may have a depth d which is slightly larger than the predetermined final thickness $t_f$ of the electronic components and which is less than the initial thickness $t_i$ of the wafer 110.

Figure 7C:
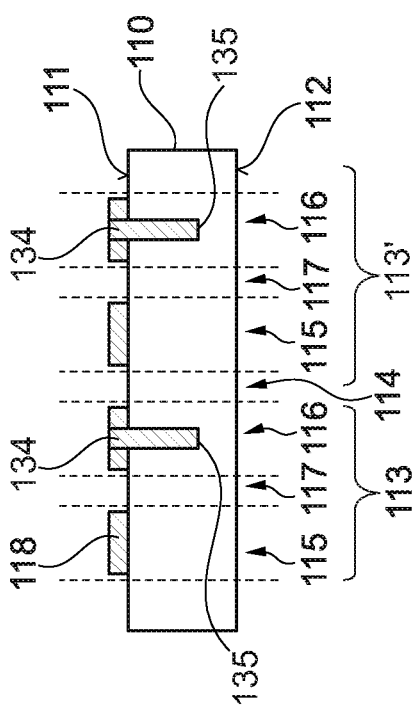
FIG. 7C illustrates the wafer after application of a first polymer layer.

FIG. 7C illustrates the wafer 110 after a first polymer layer 121, which in this embodiment comprises epoxy, has been inserted into the first trenches 119 and second trenches 120. In this embodiment, the first polymer layer 121 also extends over the peripheral regions of the discrete portions of the first metallization layer 118 and therefore has an uppermost outer surface 122 which is positioned in a plane above the outer surface 123 of the first metallization structure 118. In other embodiments, the first polymer layer may abut the portions of the first metallization layer and form a substantially coplanar surface.

Figure 7D:
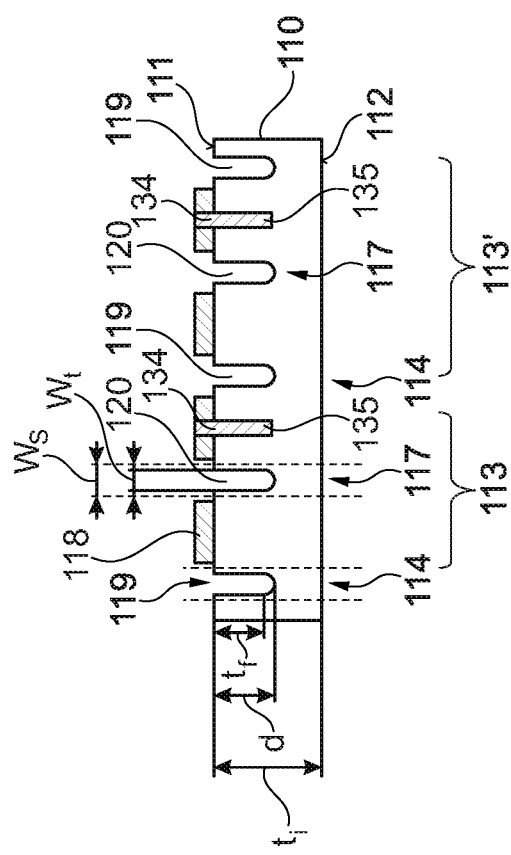
FIG. 7D illustrates the wafer after application of a carrier.

FIG. 7D illustrates the wafer 110 after a carrier 124 has been applied to the outer surface 122 of the first polymer layer 121. Since the outer surface 122 of the first polymer layer 121 is arranged at a plane above the outer surface 123 of the first metallization layer 118, cavities 125 are formed between the carrier 124 and the first metallization structure 118.

Figure 7E:
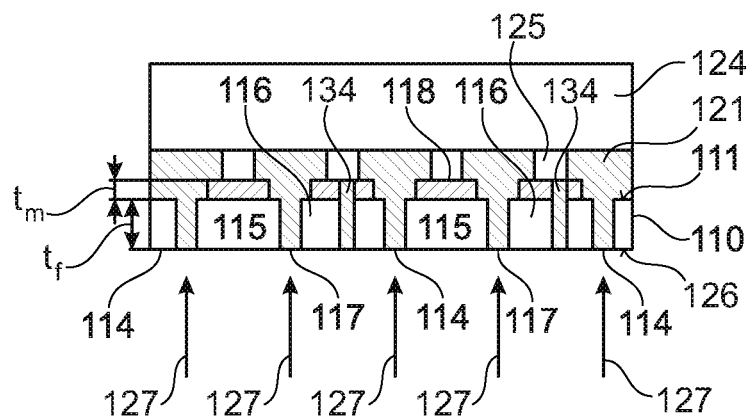
FIG. 7E illustrates the removal of portions of the second major surface of the wafer.

FIG. 7E illustrates the removal of portions of the second major surface 112 of the semiconductor wafer 110 so that the initial thickness $t_i$ of the wafer 110 is reduced to the final desired thickness $t_f$ and such that portions of the first polymer layer 121 arranged in the separation region 114 and in the non-device regions 117 are exposed in the worked second surface 126 and the conductive material arranged in the blind vias 134 in the second device positions 116 is exposed at the worked second surface to produce a through contact or through-silicon-via (TSV). The removal of portions of the wafer 110 is indicated schematically in FIG. 7E by the arrows 127. The portions of the second surface 112 of the semiconductor wafer 110 may be removed by grinding and/or chemical mechanical polishing, for example.

Figure 7F:
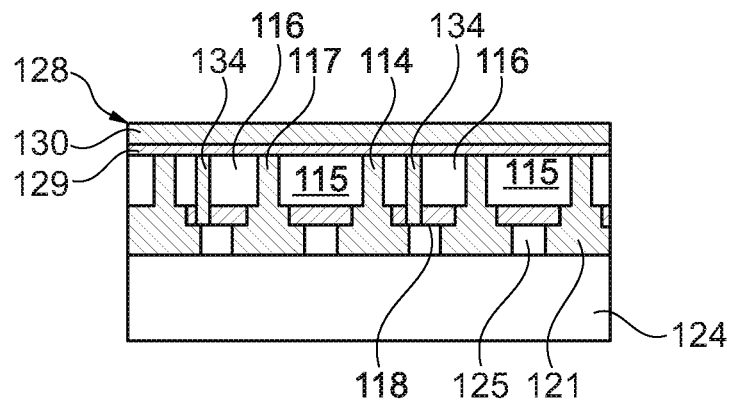
FIG. 7F illustrates the application of a second metallization structure to the worked second surface of the wafer.

FIG. 7F illustrates the application of a second metallization structure 128 to the worked second surface 126. In some embodiments, one or more insulation layers, for example an oxide layer, may be applied to the worked second surface 126 and structured before application of the second metallization structure 128 to the worked second surface. The second metallization layer 128 may include a seed layer 129 and further conductive layer 130 applied to the seed layer 129. The second metallization layer 128 may be applied such that it forms a closed layer extending over the exposed portions of the first polymer layer 121, the worked second surface 131 of the device regions 115, 116 and portions of the conductive material in the vias 134 which are exposed at the worked second surface 126.

Figure 7G:
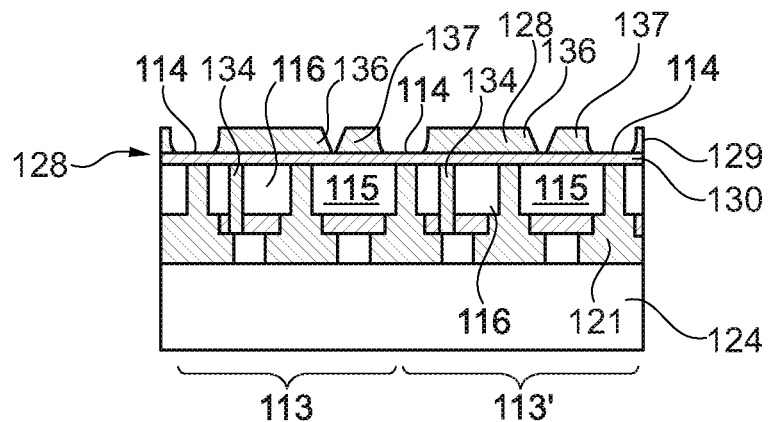
FIG. 7G illustrates the structuring of the second metallization structure.
Figure 7H:
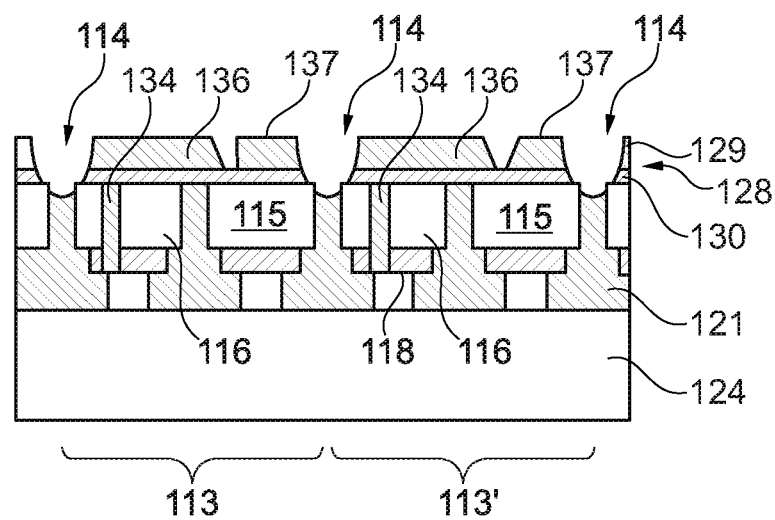
FIG. 7H illustrates the structuring of the second metallization structure.

The conductive layer 130 may be structured as illustrated in FIG. 7G so that the separation 114 regions are free of the conductive layer. The structure of the second metallization layer 128 may be carried out such that an electrical connection between the first device area 115 and the second device area 116 within each component position 113 is formed. One or more further discrete conductive areas may also be formed within one or both of the component positions 113 depending on the desired electrical connections for the circuit.

The conductive via 134 may be electrically coupled to a structured portion 136 of the second metallization layer 128 that extends over the non-device region 117 onto the other device, for example from the second device area 116 to the first device area 115 in the embodiment illustrated in FIG. 7G. One or more further discrete structured portions 137 that are separate from the structured portion 136 may be formed on the first device area 115 and/or second device area 116. The device area including a via may include a discrete portion and a potion that extends onto a neighbouring device area.

Figure 7I:
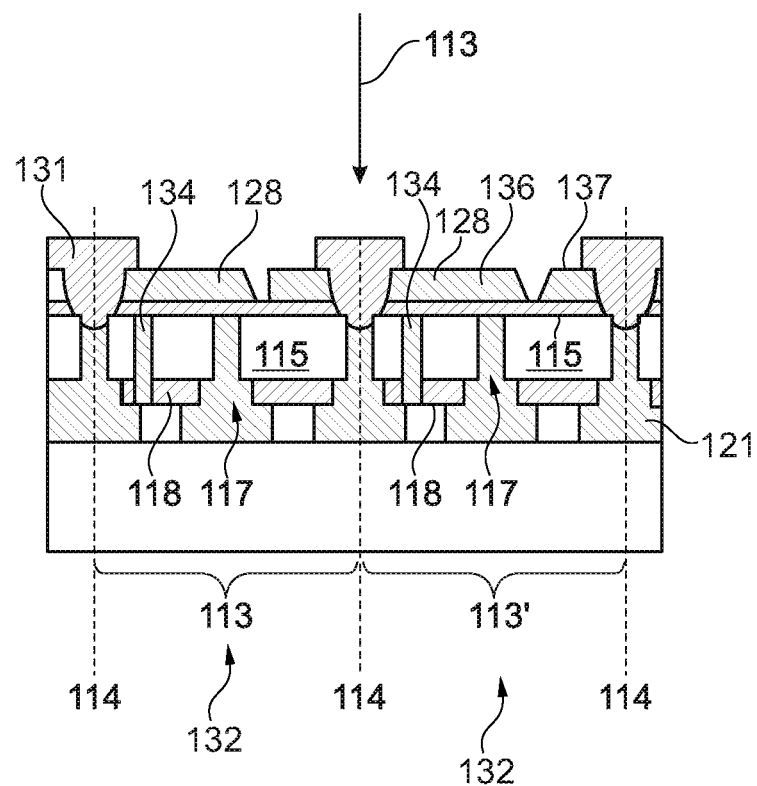
FIG. 7I illustrates the application of a second polymer layer and separation of semiconductor modules.

In some embodiments, a second polymer layer 131 may be applied to the separation regions 114 and non-device regions 117 at the worked second surface 126. In some embodiments, such as that illustrated in FIG. 7H, the second metallization layer 128 may be structured such that both the conductive layer 130 and the seed layer 129 and some portions of the first polymer layer 121 arranged at the worked second surface 126 in the separation regions 114 are removed. The second polymer layer 131 may be applied in the separation regions 114 as illustrated in FIG. 7I such that it is in contact with the first polymer layer 121 and overlaps peripheral regions of the second metallization layer 128 formed in the component positions 113. The interface between the first polymer layer and the second polymer layer 131 may be positioned adjacent sidewalls of the device regions 115, 116. The semiconductor modules 132 may then be singulated from the wafer by inserting a separation line 133, for example by sawing, along the separation regions 114. The width of the separation line may be less than the width of the separation region 114 such that the outermost side faces of the individual modules 132 are covered by the first and second epoxy layers 121, 131.

In some embodiments, the semiconductor module 132 includes a redistribution structure including a vertical portion which extends substantially perpendicular to the first and second lateral major surfaces. As discussed above, this vertical portion may be provided by a conductive via which may be positioned within one or more of the device regions 115, 116 and consequently have sidewalls formed by semiconductor material of the electronic device. Sidewalls of the via may be lined with an insulating material so as to electrically insulate the conductive material within the via from the semiconductor material of the electronic device. The conductive material may include one or more metals.

In other embodiments, the conductive via may be positioned in the non-device region 117 and formed by inserting a further trench in the polymer material in the non-device region 117. Such a conductive via extends substantially parallel to side faces of the adjacent device regions 115, 116. The conductive material within the via is electrically insulated from the semiconductor material of the device regions 115, 116 by the polymer material. The sidewalls of the conductive via are formed by polymer material.

In some embodiments, the vertical portion of the redistribution structure may be formed by semiconductor material and may be formed by a portion or island of semiconductor material positioned within the device region.

Figure 8:
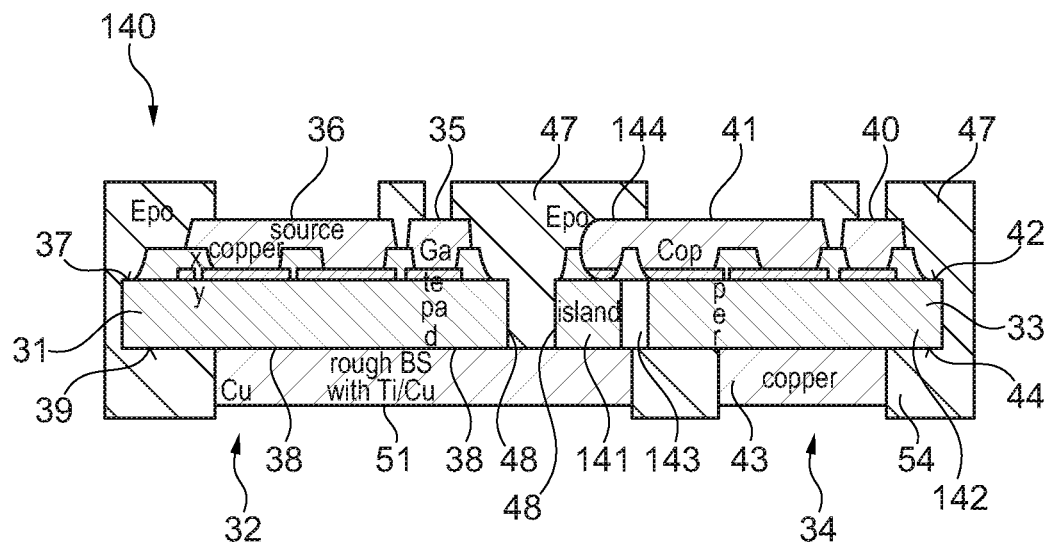
FIG. 8 illustrates a cross-sectional view of a semiconductor module.

FIG. 8 illustrates a cross-sectional view of a module 140 including the first electronic device 31 arranged in a first device region 32 and second electronic device 33 formed in a second device region 34 as in the embodiment illustrated in FIG. 2. The semiconductor module 140 differs in the form of the vertical portion of the redistribution structure between the drain pad 38 on the second surface 39 of the first electronic device 31 and the source pad 41 arranged on the first surface 42 of the second electronic device 33. In this embodiment, the second device region 34 comprises an island 141 of semiconductor material which is electrically insulated from the further semiconductor material 142 of the second electronic device 33 by insulating material 143. The insulation layer 143 extends form the first surface 42 to the second surface 44 to isolate the island 141 from the remainder of the second electronic device 33.

In the embodiment illustrated in FIG. 8, the island 141 is formed at the periphery of the second electronic component 33 and is bounded on at least one side by a portion of the polymer material first polymer layer 47 which is arranged between the side faces 48 of the first and second electronic devices 31, 33.

The island 141 may include a semiconductor material having a conductivity which is higher than the conductivity of the semiconductor material 142 of the electronic device. The island 141 may be more highly doped that the semiconductor material of the electronic device. In embodiments in which the electronic devices 31, 33 are formed from a semiconductor wafer including an epitaxial layer on a substrate, the epitaxial layer may be processed to form the transistor device structures at the first surface 37, 42. The substrate may be highly doped and have a sufficient conductivity for forming the drain region and a portion of the redistribution structure. In these embodiments, the upper epitaxial layer may be removed from the substrate at the upper portion of the island 141 and replaced by material having a higher conductivity in order to form a vertical conductive connection from the first surface 42 to the opposing second surface 44. Alternatively, the conductivity of the epitaxial layer may be locally increased in the island 141 by increasing the doping level, for example, by implantation, a contact extending through the upper epitaxial layer to the underlying substrate or the combination of a contact extending through the upper epitaxial layer and a locally increased doping level may be used.

The conductive island 141 may be electrically coupled to the source pad 41 arranged on the first surface 42 of the second electronic component 33 by a conductive layer 144 which extends between the island 141 and the source pad 41. The conductive island 141 may be electrically coupled to the drain pad 38 arranged on the second surface 39 of the first electronic component 31 by the conductive layer 51 on the opposite side of the island 141 which extends from the drain pad 38 to the island 141. The conductive layer 51 has a lateral extent such that its periphery is arranged on the insulating material 143 and stops short of the semiconductor body of the second electronic device 33 so that it is not arranged on the rear side 44 of the electronic device 33.

In other embodiments, the island may be formed within the semiconductor material of the device region such that it is surrounded on all side faces by the insulating material 143.

A second polymer layer 54 may be arranged on the second surface 39 of the first electronic device 31 and second surface 44 of the second electronic device 33 between the further conductive layer 51 and drain pad 38 and at the periphery of the module. The second polymer layer 54 may also entirely cover the further conductive layer 51.

Figure 9:
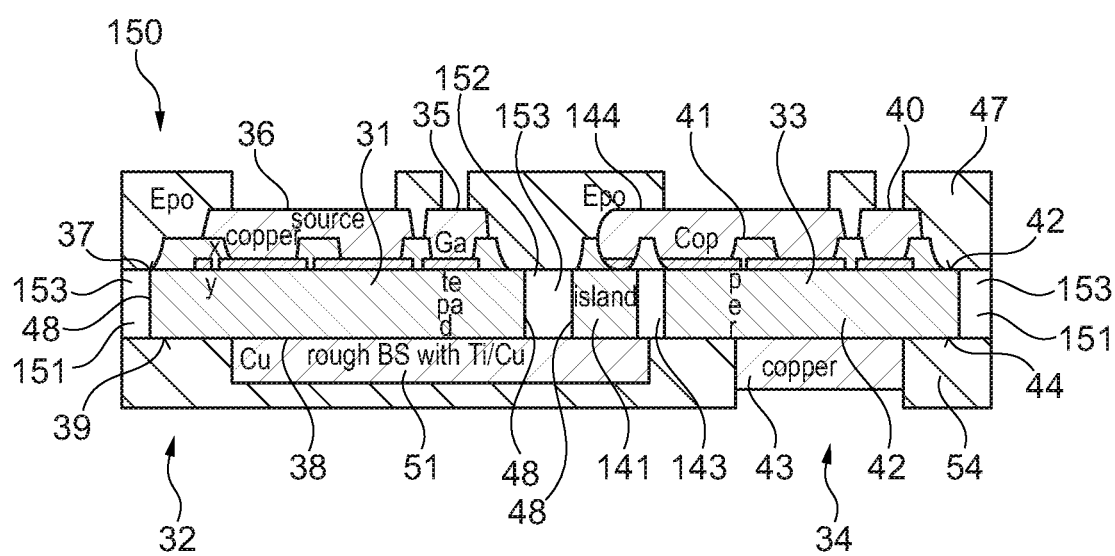
FIG. 9 illustrates a cross-sectional view of a semiconductor module.

FIG. 9 illustrates a semiconductor module 150 which includes a first electronic device 31 arranged in a first device region 32 and second electronic device 33 formed in a second device region 34 as in the embodiment illustrated in FIG. 2. The semiconductor module 150 further includes a redistribution structure between the drain pad 38 on the second surface 39 of the first electronic device 31 and the source pad 41 arranged on the first surface 42 of the second electronic device 33 in the form of a conductive island 141 of semiconductor material as in the embodiment illustrated in FIG. 8. The conductive island 141 is electrically insulated from the further semiconductor material 142 of the second electronic device 33 by insulating material 143.

The semiconductor module 150 differs from the semiconductor module 140 of FIG. 8 in that the separation regions 151 formed between the outermost facing side faces 48 of the device regions 32, 34 of the module 150 and the non-device regions 152 extending between side faces 48 include insulating material 153 which is separate from the first and second polymer layers 47, 54. The insulating material 153 may be the same as or different from the insulating material 143 which electrically insulates the conducive island 141 providing the vertical redistribution structure from the body of the second semiconductor device 33. The insulating material 153 may comprise an oxide or a nitride, such as $SiO_2$ for example.

The insulating material 153 has a thickness which corresponds to the thickness of the first electronic device 31 and the second electronic device 33 and extends from the first surface 37 to the second surface of the first electronic device 31 and from the first surface 42 to the second surface 44 of the second electronic device 33. The first polymer layer 47 is arranged on the insulating material 153 in the separation regions 151 and in the non-device regions 152. The second polymer layer 54 is arranged on the insulating material 153 in the separation regions 151.

The conductive layer 51 extends from the drain pad 38 over the second major surface 37 of the first electronic device 31 and over the insulating material 153 in the non-device region 151. The conductive layer 51 has a lateral extent such that its periphery is arranged on the insulating material 143 which insulates the island 141 from the semiconductor body of the second electronic device 33 and stops short of the semiconductor body of the second electronic device 33 so that it is not arranged on or electrically coupled with the rear side 44 of the electronic device 33.

As in the embodiment illustrated in FIG. 3B, the further conductive layer 51 may be entirely covered by the second polymer layer 54, as illustrated in FIG. 9, or abut the further conductive layer 51, as in the embodiment illustrated in FIG. 8.

To summarize, embodiments described herein, combine advantages of multi-chip dies like closer chip distances, single picking of multi-chip die, and front-side contacting of gate and sense-pads and can be used to provide a module and electronic component with a desired circuit cost-effectively and efficiently.

Spatially relative terms such as "under", "below", "lower", "over", "upper" and the like are used for ease of description to explain the positioning of one element relative to a second element. These terms are intended to encompass different orientations of the device in addition to different orientations than those depicted in the figures. Further, terms such as "first", "second", and the like, are also used to describe various elements, regions, sections, etc. and are also not intended to be limiting. Like terms refer to like elements throughout the description.

As used herein, the terms "having", "containing", "including", "comprising" and the like are open ended terms that indicate the presence of stated elements or features, but do not preclude additional elements or features. The articles "a", "an" and "the" are intended to include the plural as well as the singular, unless the context clearly indicates otherwise. It is to be understood that the features of the various embodiments described herein may be combined with each other, unless specifically noted otherwise.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A method, comprising:
   forming at least one trench in separation regions of a first surface of a semiconductor wafer;
   forming at least one trench in non-device regions of the first surface of the semiconductor wafer, the separation regions being arranged between component positions of the semiconductor wafer, the component positions comprising at least two electronic devices for forming a circuit, a non-device region arranged between a first device region comprising a first electronic device and a second device region comprising a second electronic device, and a first metallization structure arranged on the first surface in the first device region and in the second device region;
   applying a first epoxy layer to the first surface of the semiconductor wafer such that the at least one trench in separation regions, the at least one trench in non-device regions, edge regions of the component positions, edge regions of the first device region and edge regions of the second device region are covered with the first epoxy layer;
   removing portions of a second surface of the semiconductor wafer, the second surface opposing the first surface, to reveal portions of the first epoxy layer in the separation regions and in the non-device regions and to produce a worked second surface;
   applying a second metallization layer to the worked second surface and operably coupling the first electronic device to the second electronic device to form the circuit;
   inserting a separation line through the first epoxy layer in the separation regions to form a plurality of separate semiconductor modules comprising the circuit;
   inserting conductive material into the at least one trench formed in the non-device regions; and
   electrically coupling the conductive material to the first electronic device and to the second electronic device.

2. The method of claim 1, further comprising:
   inserting a via into the second device region;
   inserting conductive material into the via; and
   electrically coupling the conductive material to the first electronic device and to the second electronic device.

3. The method of claim 2, wherein the via is inserted into the first surface of the semiconductor wafer and afterwards, the first metallization structure and the first epoxy layer is applied to the first surface and portions of the second surface of the semiconductor wafer are removed, or the via is inserted into the worked second surface of the semiconductor wafer.

4. The method of claim 1, wherein the first epoxy layer is inserted into the at least one trench formed in the non-device regions, a via is formed in the first epoxy layer in the non-device regions such that side faces of the first device region and of the second device region bounding the via are covered with the first epoxy layer and the conductive material is applied to the first epoxy layer in the via, the conductive material extending from the first metallization structure in the second device region to the worked second surface.

5. The method of claim 1, wherein a conductive via from the first surface of the semiconductor wafer to the worked second surface of the semiconductor wafer is formed by a conductive portion of the first device region or of the second device region, the conductive portion extending from the first surface of the semiconductor wafer to the worked second surface of the semiconductor wafer.

6. The method of claim 5, wherein the second metallization layer is applied to the conductive material within the via to operably couple the first electronic device to the second electronic device.

7. The method of claim 1, wherein the second metallization layer extends from the first device region over the non-device region to the second device region.

8. The method of claim 1, wherein the separation line has a width that is less than the width of the at least one trench in the separation regions such that at least portions of side faces of the plurality of separate semiconductor modules comprise a portion of the first epoxy layer.

9. The method of claim 1, wherein the first epoxy layer further covers edge regions of the first metallization structure.

10. The method of claim 1, further comprising applying a second epoxy layer to the worked second surface that covers at least the first epoxy layer arranged in the separation regions.

11. The method of claim 10, wherein the second epoxy layer covers the second metallization layer arranged on the first device region and exposes the second metallization layer arranged on the second device region.

12. The method of claim 1, wherein the separate semiconductor modules each comprise the first device region comprising the first electronic device, the second device region comprising the second electronic device and the at least one trench in non-device regions, the at least one trench in non-device regions of the separate semiconductor modules being disposed between the first device region and the second device region and being filled by epoxy material from the first epoxy layer.

* * * * *